United States Patent
Kim (10) Patent No.: US 10,680,658 B2
(45) Date of Patent: Jun. 9, 2020

(54) DECODER CONTROLLER, ERROR CORRECTION CIRCUIT, OPERATING METHOD THEREOF AND DATA STORAGE DEVICE INCLUDING THE SAME

(71) Applicant: SK hynix Inc., Icheon-si, Gyeonggi-do (KR)

(72) Inventor: Jang Seob Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 52 days.

(21) Appl. No.: 16/105,829

(22) Filed: Aug. 20, 2018

(65) Prior Publication Data
US 2019/0081644 A1 Mar. 14, 2019

(30) Foreign Application Priority Data
Sep. 14, 2017 (KR) .......................... 10-2017-0117535

(51) Int. Cl.
*H03M 13/00* (2006.01)
*H03M 13/37* (2006.01)
*G06F 11/10* (2006.01)
*H03M 13/29* (2006.01)
*H03M 13/45* (2006.01)

(52) U.S. Cl.
CPC ......... *H03M 13/37* (2013.01); *G06F 11/1012* (2013.01); *G06F 11/1076* (2013.01); *H03M 13/2963* (2013.01); *H03M 13/453* (2013.01)

(58) Field of Classification Search
None
See application file for complete search history.

(56) References Cited

U.S. PATENT DOCUMENTS

| | | | |
|---|---|---|---|
| 8,938,664 B2 * | 1/2015 | Alrod | H03M 13/3707 |
| | | | 235/456 |
| 9,231,623 B1 | 1/2016 | Kumar et al. | |
| 9,600,364 B2 | 3/2017 | Torii et al. | |
| 2016/0344426 A1 * | 11/2016 | Bhatia | H03M 13/2927 |
| 2017/0279468 A1 * | 9/2017 | Kumar | H03M 13/2909 |
| 2018/0219561 A1 * | 8/2018 | Litsyn | H03M 13/2909 |

OTHER PUBLICATIONS

J. Freudenberger, A. Beck and M. Rajab, "A data compression scheme for reliable data storage in non-volatile memories," 2015 IEEE 5th International Conference on Consumer Electronics—Berlin (ICCE-Berlin), Berlin, 2015, pp. 139-142. (Year: 2015).*

* cited by examiner

*Primary Examiner* — Daniel F. McMahon
(74) *Attorney, Agent, or Firm* — William Park & Associates Ltd.

(57) ABSTRACT

The decoder controller includes flip number management section configured to, after a decoding operation for a codeword of a first direction succeeds, decrease flip numbers of all codewords of a second direction which intersect with the codeword of the first direction and have error-probable areas.

18 Claims, 7 Drawing Sheets

DECODER CONTROLLER, ERROR CORRECTION CIRCUIT, OPERATING METHOD THEREOF AND DATA STORAGE DEVICE INCLUDING THE SAME

CROSS-REFERENCES TO RELATED APPLICATION

The present application claims priority under 35 U.S.C. § 119(a) to Korean application number 10-2017-0117535, filed on Sep. 14, 2017, which is incorporated herein by reference in its entirety.

BACKGROUND

1. Technical Field

Various embodiments generally relate to a decoder controller, an error correction circuit, and, more particularly, to a decoder controller and/or an error correction circuit which is applied to a data storage device.

2. Related Art

A data storage device may be configured to store the data provided from an external device, in response to a write request from the external device. Also, the data storage device may be configured to provide stored data to the external device, in response to a read request from the external device. The external device as an electronic device capable of processing data may include a computer, a digital camera or a mobile phone. The data storage device may operate by being built in the external device, or may operate by being manufactured in a separable form and being coupled to the external device.

A data storage device may include an error correction circuit. The error correction circuit may perform an encoding operation for the data transmitted from an external device, and the data storage device may store the data added with parity data through the encoding operation. Also, when the external device requests stored data, the error correction circuit may perform a decoding operation for stored data, and the data storage device may transmit the data error-corrected through the decoding operation to the external device.

The error correction capability of the error correction circuit and quick completion of an error correction operation may be directly connected with the data reliability and operational performance of the data storage device.

SUMMARY

In an embodiment, an error correction circuit may be provided. The error correction circuit may include a decoder controller configured to receive a data chunk including a plurality of data blocks, each of the data blocks being included in a corresponding codeword of a first direction and a corresponding codeword of a second direction. The error correction circuit may include a decoder configured to perform a first decoding operation for a first codeword of the first direction according to control of the decoder controller. The decoder controller may adjust a flip number of a second codeword of the second direction depending on a result of the first decoding operation, and may perform a chase decoding process for the second codeword based on the flip number.

In an embodiment, a method for operating an error correction circuit may be provided. The method may include receiving a data chunk including a plurality of data blocks. Each of the data blocks may be included in a corresponding codeword of a first direction and a corresponding codeword of a second direction. The method may include performing a first decoding operation for a first codeword of the first direction. The method may include adjusting a flip number of a second codeword of the second direction depending on a result of the first decoding operation. The method may include performing a chase decoding process for the second codeword based on the flip number.

In an embodiment, the adjusting of the flip number may include identifying at least one corrected data block in the first codeword when the first decoding operation succeeds; and selecting a codeword of the second direction including the corrected data block, as the second codeword.

In an embodiment, the adjusting of the flip number may include decreasing the flip number when the first decoding operation succeeds.

In an embodiment, the adjusting of the flip number may include identifying at least one corrected data block in the first codeword when the first decoding operation succeeds; determining an adjustment value corresponding to a correction rate of the corrected data block; and adjusting the flip number by the adjustment value.

In an embodiment, the correction rate may correspond to the number of errors corrected in the corrected data block.

In an embodiment, if the correction rate is increased then the adjustment value may be also increased.

In an embodiment, the adjusting of the flip number may include identifying at least one corrected data block in the first codeword when the first decoding operation succeeds; determining an adjustment value corresponding to a corrected data block, in the first codeword, intersecting with the second codeword; and adjusting the flip number by the adjustment value.

In an embodiment, the performing of the chase decoding process may include performing a flip operation by flipping different combinations of bits of the flip number within a flip range of the second codeword; and repeating a decoding operation for the second codeword for which the flip operation is performed.

In an embodiment, the method may include increasing a flip number of the first codeword when the first decoding operation fails.

In an embodiment, the method may include ending the decoding process for the first codeword when the decoding operation fails for the first codeword after a flip number of the first codeword is increased to equal a predetermined threshold number or is increased to be greater than the predetermined threshold number.

In an embodiment, a data storage device may be provided. The data storage device may include a nonvolatile memory device configured to read and output a data chunk including a plurality of data blocks. Each of the data blocks may be included in a corresponding codeword of a first direction and a corresponding codeword of a second direction. The data storage device may include an error correction circuit including a decoder controller and a decoder configured to perform a first decoding operation for a first codeword of the first direction according to control of the decoder controller. The decoder controller may adjust a flip number of a second codeword of the second direction depending on a result of the first decoding operation, and may perform a chase decoding process for the second codeword based on the flip number.

In an embodiment, a decoder controller may be provided. The decoder controller may include flip number management section configured to, after a decoding operation for a codeword of a first direction succeeds, decrease flip numbers of all codewords of a second direction which intersect with the codeword of the first direction and have error-probable areas.

DETAILED DESCRIPTION

Hereinafter, an error correction circuit, an operating method thereof and a data storage device including the same will be described with reference to the accompanying drawings through examples of embodiments. The present embodiments may, however, be embodied in different forms and should not be construed as being limited to the embodiments set forth herein.

It is to be understood that embodiments of the present description are not limited to the particulars illustrated in the drawings, that the drawings are not necessarily to scale, and, in some instances, proportions may have been exaggerated in order to more clearly depict certain features. While particular terminology is used, it is to be appreciated that the terminology used is for describing particular embodiments only and is not intended to limit the scope of the present disclosure.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present embodiment belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present description.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments will be described with reference to the attached drawings.

Figure 1:
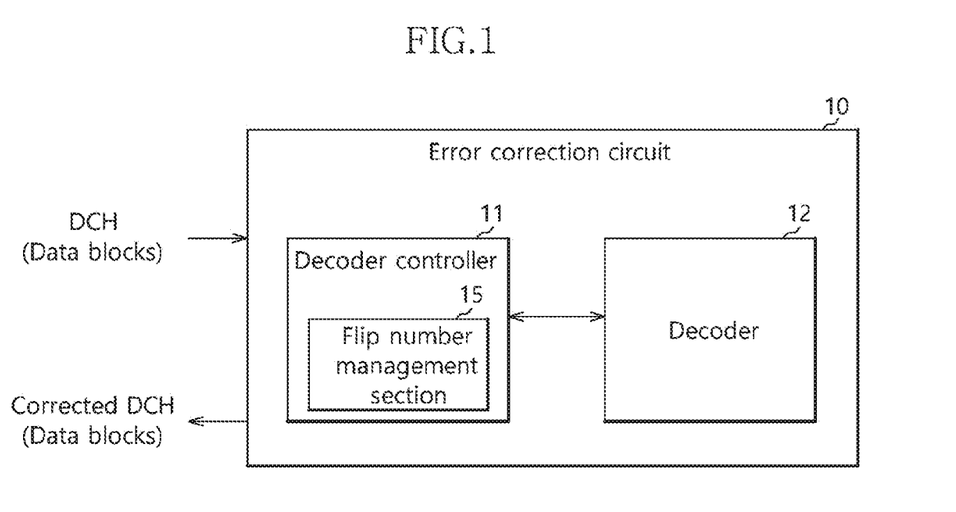
FIG. 1 is a block diagram illustrating a representation of an example of an error correction circuit in accordance with an embodiment.

FIG. 1 is a block diagram illustrating a representation of an example of an error correction circuit 10 in accordance with an embodiment.

The error correction circuit 10 may receive a data chunk DCH, perform an error correction operation for the data chunk DCH, and output a corrected data chunk DCH.

The data chunk DCH may be data generated based on a TPC (turbo product code) algorithm. The data chunk DCH may include a plurality of data blocks, and each of the data blocks may be included in a corresponding codeword of a first direction and a corresponding codeword of a second direction. The first direction and the second direction may be a row direction and a column direction or vice versa. Therefore, the data chunk DCH may include codewords of the row direction, that is, row codewords, and codewords of the column direction, that is, column codewords. The structure of the data chunk DCH will be described with reference to FIG. 2.

The error correction circuit 10 may include a decoder controller 11 and a decoder 12. In an embodiment, the decoder controller 11 may be implemented with software, hardware, or any combination thereof. In an embodiment, the decoder 12 may be implemented with software, hardware, or any combination thereof.

The decoder controller 11 may select a codeword for which a decoding operation is to be performed, in the data chunk DCH, and may provide the selected codeword to the decoder 12. The decoder controller 11 may control the decoder 12 to perform a decoding operation for a codeword having a high possibility of success in the decoding operation.

The decoder controller 11 may perform a predecoding process for the data chunk DCH. In the predecoding process, the decoder 12 may perform a decoding operation for each of the codewords included in the data chunk DCH according to control of the decoder controller 11. While the decoding operation for each of the codewords may be performed based on, for example, a BCH algorithm, it is to be noted that the embodiment is not limited thereto. The decoder 12 may successfully complete the error correction operation for the data chunk DCH through the predecoding process or may fail in decoding operations for some codewords of the data chunk DCH.

The decoder controller 11 may perform a chase decoding process for the data chunk DCH. The decoder controller 11 may perform the chase decoding process for codewords for which decoding operations have failed in the predecoding process. The chase decoding process for a certain codeword may be performed by repeating a flip operation and a decoding operation until the decoding operation succeeds and the codeword is decoded. In an embodiment, for example a decoding operation succeeds for a certain codeword when there are no longer any errors included in the codeword and there are no errors in all of the data blocks included in the codeword. The decoder controller 11 may perform the flip operation within a predetermined flip range selected in the codeword. The decoder controller 11 may perform the flip operation by flipping combinations of different bits included in the flip range each time the decoding operation is repeated. The number of bits to be flipped within the flip range may be limited to a predetermined flip number, and the flip number may be increased if the decoding operation using the corresponding predetermined flip number continues to fail. An increase in a flip number may excessively increase a decoding time. While the decoding operation in the chase decoding process may also be performed based on, for example, a BCH algorithm, it is to be noted that the embodiment is not limited thereto.

The decoder controller 11 may include a flip number management section 15. The flip number management section 15 may manage the flip numbers of the code words of the data chunk DCH in the first direction and the second direction. When a decoding operation in the chase decoding process performed for a certain codeword by using a predetermined flip number resultantly fails, the flip number management section 15 may increase the flip number of the corresponding codeword. In an embodiment, the flip number management section 15 may be implemented with software, hardware, or any combination thereof.

Also, the flip number management section 15 may adjust the flip number of a codeword of the second direction depending on a result of a decoding operation for a codeword of the first direction. For example, when a decoding operation in the chase decoding process performed for a codeword of the first direction succeeds, the flip number management section 15 may identify at least one corrected data block in the codeword of the first direction, and may decrease the flip number of a codeword of the second direction including the corrected data block. Therefore, the decoder 12 may perform the chase decoding process for the codeword of the second direction based on the decreased flip number.

According to an embodiment, when a decoding operation in the chase decoding process performed for a codeword of the first direction succeeds, the flip number management section 15 may calculate the correction rate of the data block corrected in the codeword of the first direction. The flip number management section 15 may determine an adjustment value corresponding to the correction rate. The higher the correction rate is, the greater the adjustment value may be. The flip number management section 15 may decrease the flip number of a codeword of the second direction including the corrected data block, by the determined adjustment value.

The decoder 12 may perform a decoding operation for a codeword selected by the decoder controller 11. The decoder 12 may notify the decoder controller 11 of whether the decoding operation is a success or a failure. The decoder 12 may perform a decoding operation for a codeword based on a BCH algorithm.

Figure 2:
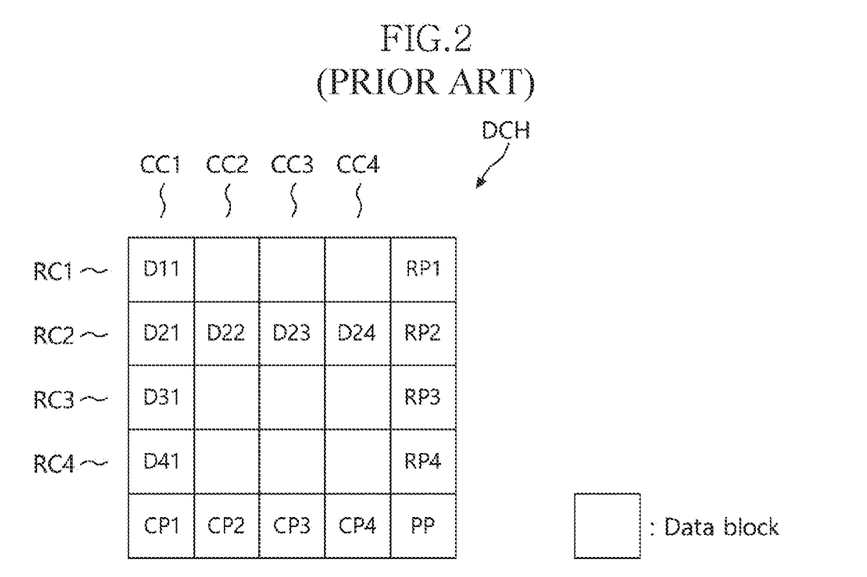
FIG. 2 is a diagram illustrating a representation of an example of a data chunk based on a TPC algorithm.

FIG. 2 is a diagram illustrating a representation of an example of a data chunk DCH based on a TPC algorithm.

Referring to FIG. 2, the data chunk DCH generated based on the TPC algorithm may include a plurality of data blocks. While not illustrated, each of the data blocks may include a plurality of data bits. The data blocks may be combined to configure row codewords RC1 to RC4 and column codewords CC1 to CC4. A certain one data block may be included in a certain one row codeword and at the same time may be included in a certain one column codeword. Codewords of a row direction may mean the row codewords RC1 to RC4, and codewords of a column direction may mean the column codewords CC1 to CC4. While FIG. 2 illustrates the data chunk DCH which is configured by the four row codewords RC1 to RC4 and the four column codewords CC1 to CC4, it is to be noted that the numbers of row codewords and column codewords included in the data chunk DCH are not limited thereto.

The row codewords RC1 to RC4 may include row parity data blocks RP1 to RP4. Each of the row codewords RC1 to RC4 may include a row parity data block which is generated as corresponding data blocks are encoded. For example, the row codeword RC2 may include the row parity data block RP2 which is generated as data blocks D21 to D24 are encoded. While an encoding operation may be performed based on, for example, a BCH algorithm, to generate each of the row parity data blocks RP1 to RP4, it is to be noted that an encoding operation is not limited thereto in the present embodiment and may be performed based on various ECC algorithms.

The column codewords CC1 to CC4 may include column parity data blocks CP1 to CP4. Each of the column codewords CC1 to CC4 may include a column parity data block which is generated as corresponding data blocks are encoded. For example, the column codeword CC1 may include the column parity data block CP1 which is generated as data blocks D11 to D41 are encoded. While an encoding operation may be performed based on, for example, a BCH algorithm, to generate each of the column parity data blocks CP1 to CP4, it is to be noted that an encoding operation is not limited thereto in the present embodiments and may be performed based on various ECC algorithms.

The data chunk DCH may further include an additional parity data block PP. The additional parity data block PP may be generated as the row parity data blocks RP1 to RP4 and the column parity data blocks CP1 to CP4 are encoded. The additional parity data block PP may be used to correct an error occurred in the row parity data blocks RP1 to RP4 and the column parity data blocks CP1 to CP4.

The decoder 12 may perform decoding operations for the row codewords RC1 to RC4, based on the row parity data blocks RP1 to RP4. For example, a decoding operation for each of the row codewords RC1 to RC4 may be performed by correcting errors included in corresponding data blocks, based on a corresponding row parity data block. For example, a decoding operation for the row codeword RC2 may be performed by correcting errors included in the data blocks D21 to D24, based on the row parity data block RP2.

Similarly, the decoder 12 may perform decoding operations for the column codewords CC1 to CC4, based on the column parity data blocks CP1 to CP4. For example, a decoding operation for each of the column codewords CC1 to CC4 may be performed by correcting errors included in corresponding data blocks, based on a corresponding column parity data block. For example, a decoding operation for the column codeword CC1 may be performed by correcting errors included in the data blocks D11 to D41, based on the column parity data block CP1.

In the data chunk DCH, errors included in the same data block may be corrected through a decoding operation for a corresponding row codeword or a decoding operation for a corresponding column codeword. Therefore, errors included in the same data block may be corrected through a decoding operation for a corresponding column codeword even though they are not corrected through a decoding operation for a corresponding row codeword, or vice versa.

Figure 3:
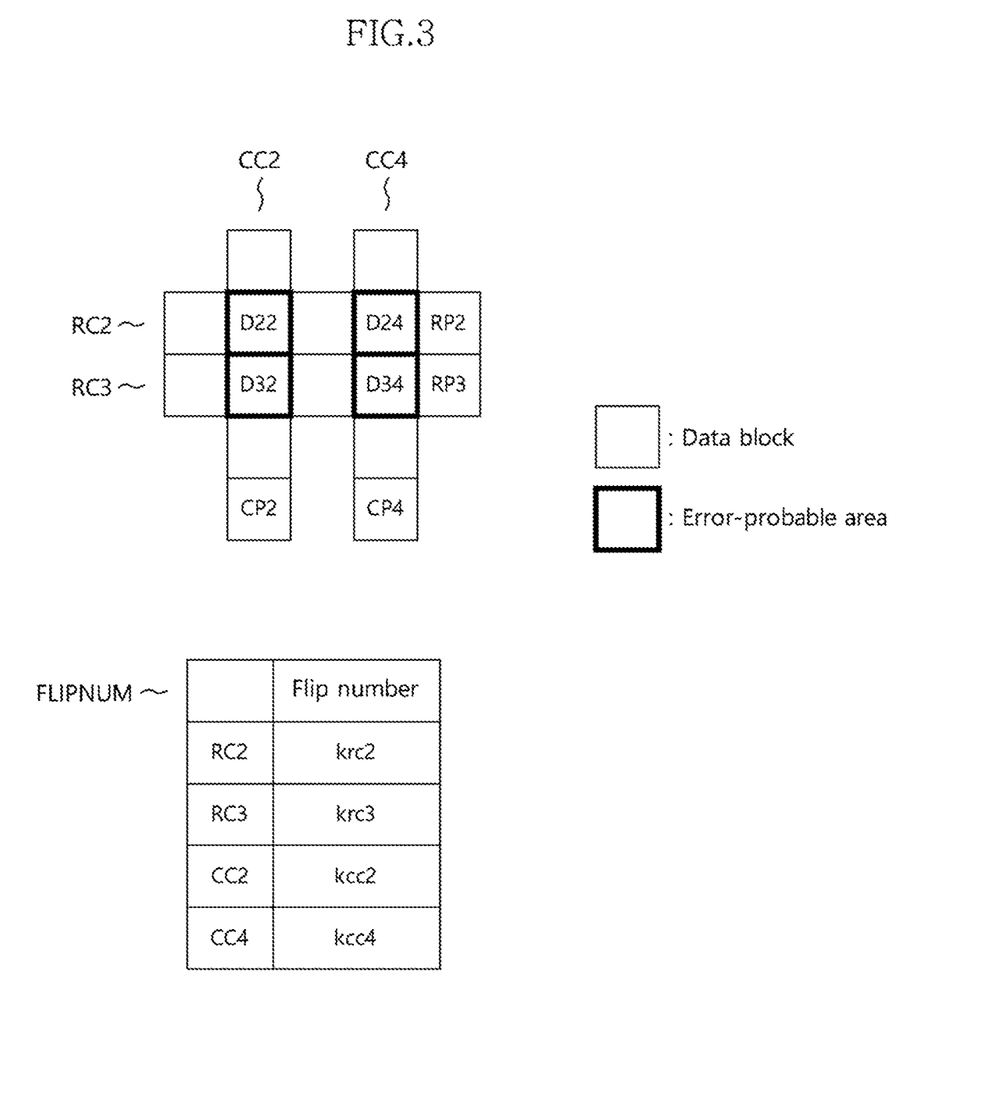
FIG. 3 is a representation of an example of a diagram to assist in the explanation of a method for the error correction circuit of FIG. 1 to perform a chase decoding process.

FIG. 3 is a representation of an example of a diagram to assist in the explanation of a method for the error correction circuit 10 of FIG. 1 to perform a chase decoding process. FIG. 3 illustrates row codewords RC2 and RC3 and column codewords CC2 and CC4 for which decoding operations have failed in a predecoding process. It is assumed that decoding operations for the other codewords of the data chunk DCH have succeeded.

Referring to FIG. 3, errors may be positioned in data blocks D22, D24, D32 and D34, that is, at intersections of the row codewords RC2 and RC3 and the column codewords CC2 and CC4. Since the decoding operations for the codewords not illustrated in FIG. 3 have succeeded in the predecoding process, positions other than the intersections D22, D24, D32 and D34 do not include an error. Each of the intersections D22, D24, D32 and D34 may not necessarily include at least one error. Errors may be present in only some of the intersections D22, D24, D32 and D34.

Therefore, when the chase decoding process is performed for each of the row codewords RC2 and RC3 and the column codewords CC2 and CC4, a flip operation may be performed at intersections included in a codeword for which a decoding operation is to be performed, among the intersections D22, D24, D32 and D34 where errors may exist. The intersections included in each of the row codewords RC2 and RC3 and the column codewords CC2 and CC4 may be the flip range of a corresponding codeword. The flip operation may be performed by finding different combinations including the bits of a flip number among the bits belonging to the flip range and by flipping the corresponding combinations. The flip number may start from "1." For a certain codeword, if a decoding operation does not succeed even after all the combinations of a predetermined flip number are attempted, the flip number of the corresponding codeword may be increased. When a decoding operation resultantly fails even though a flip number is increased to a predetermined threshold number, the chase decoding process for the corresponding codeword may be ended as a failure.

The flip number management section 15 may manage a flip number table FLIPNUM. The flip number table FLIPNUM may include flip numbers respectively corresponding to the row codewords RC2 and RC3 and the column codewords CC2 and CC4 for which the chase decoding process is to be performed. The flip number management section 15 may adjust a flip number in the flip number table FLIPNUM depending upon a result of a decoding operation.

For example, the decoder controller 11 may perform the chase decoding process for the row codeword RC2 as follows. First, a decoding operation for the row codeword RC2 may be repeated as a different one bit is flipped within the flip range of the row codeword RC2, that is, at the intersections D22 and D24, until the decoding operation succeeds. A flip number krc2 of the row codeword RC2 may be stored as "1." If the decoding operation does not succeed even though all bits are respectively flipped, the flip number krc2 of the row codeword RC2 may be increased to and stored as "2." Similarly to this, the decoder controller 11 may perform the chase decoding process for the row codeword RC3 and the column codewords CC2 and CC4.

The decoder controller 11 may perform the chase decoding process for all of the row codewords RC2 and RC3 and the column codewords CC2 and CC4 once for the flip number "1." Thereafter, the decoder controller 11 may perform the chase decoding process for the row codeword RC2 by flipping different combinations of two bits at the intersections D22 and D24 based on the flip number krc2 "2" of the row codeword RC2.

Thus, the number of times of repeating a decoding operation for a certain codeword by using a predetermined flip number "k" is the number of combinations selecting "k" number of different bits among the number "n" of all bits of one or more intersections included in the corresponding codeword, and becomes "nCk." Because "nCk" also increases as the flip number "k" increases within a predetermined range, the performance time of the chase decoding process may be lengthened.

Figure 4:
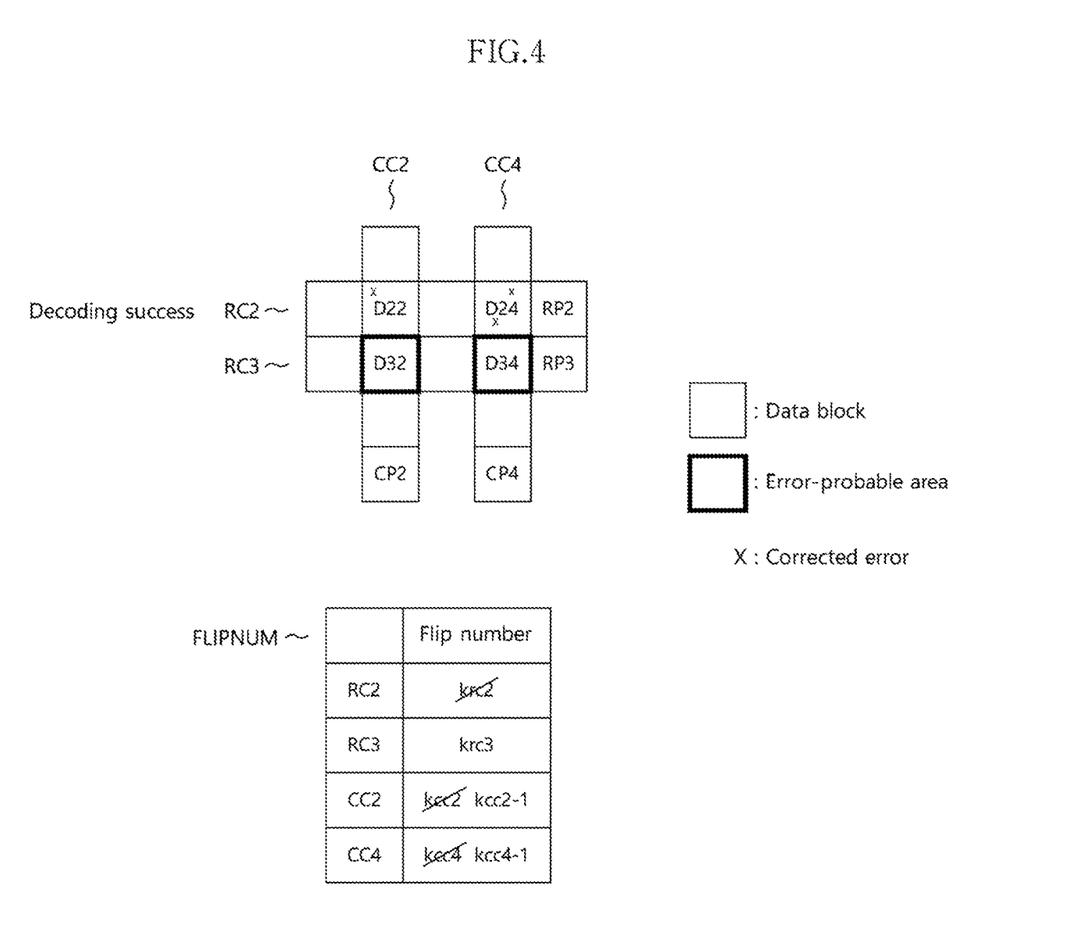
FIG. 4 is a representation of an example of a diagram to assist in the explanation of a method for the flip number management section of FIG. 1 to adjust a flip number according to a result of a decoding operation.

FIG. 4 is a representation of an example of a diagram to assist in the explanation of a method for the flip number management section 15 of FIG. 1 to adjust a flip number according to a result of a decoding operation. In FIG. 4, it is assumed that it is a situation in which the chase decoding process is to be performed for the row codewords RC2 and RC3 and the column codewords CC2 and CC4 based on respective flip numbers krc2, krc3, kcc2 and kcc4.

Referring to FIG. 4, the chase decoding process may be performed for the row codeword RC2 based on the flip number krc2 and a decoding operation may succeed. In response to this, the flip number management section 15 may remove the flip number krc2 of the row codeword RC2 such that the chase decoding process is not performed again for the row codeword RC2. For example, the flip number management section 15 may store the flip number krc2 of the row codeword RC2 as "0."

In succession, the flip number management section 15 may identify the data blocks D22 and D24 corrected in the row codeword RC2. For example, the flip number management section 15 may be aware that the chase decoding process will be performed for the row codewords RC2 and RC3 and the column codewords CC2 and CC4, and may identify the intersections D22 and D24 included in the row codeword RC2 as corrected data blocks. For another example, the flip number management section 15 may identify the corrected data blocks D22 and D24 by comparing the row codewords RC2 before and after the decoding operation is performed. Meanwhile, unlike the illustration of FIG. 4, as the case may be, only a part of the intersections D22 and D24 may be a corrected data block.

The flip number management section 15 may decrease the flip numbers kcc2 and kcc4 of the column codewords CC2 and CC4 including the corrected data blocks D22 and D24 by "1." The reason to this resides in that, because the errors included in the column codewords CC2 and CC4 are resultantly decreased through the decoding operation for the row codeword RC2, decoding operations for the column codewords CC2 and CC4 may succeed even when the flip numbers kcc2 and kcc4 are decreased. By decreasing the flip numbers kcc2 and kcc4, the performance time of the chase decoding process may be shortened.

While the operation of FIG. 4 illustrates a case where the flip number of a codeword in the column direction is adjusted when a decoding operation for a codeword in the row direction succeeds, it is to be noted that it is possible to adjust the flip number of a codeword in the row direction when a decoding operation for a codeword in the column direction succeeds.

Figure 5:
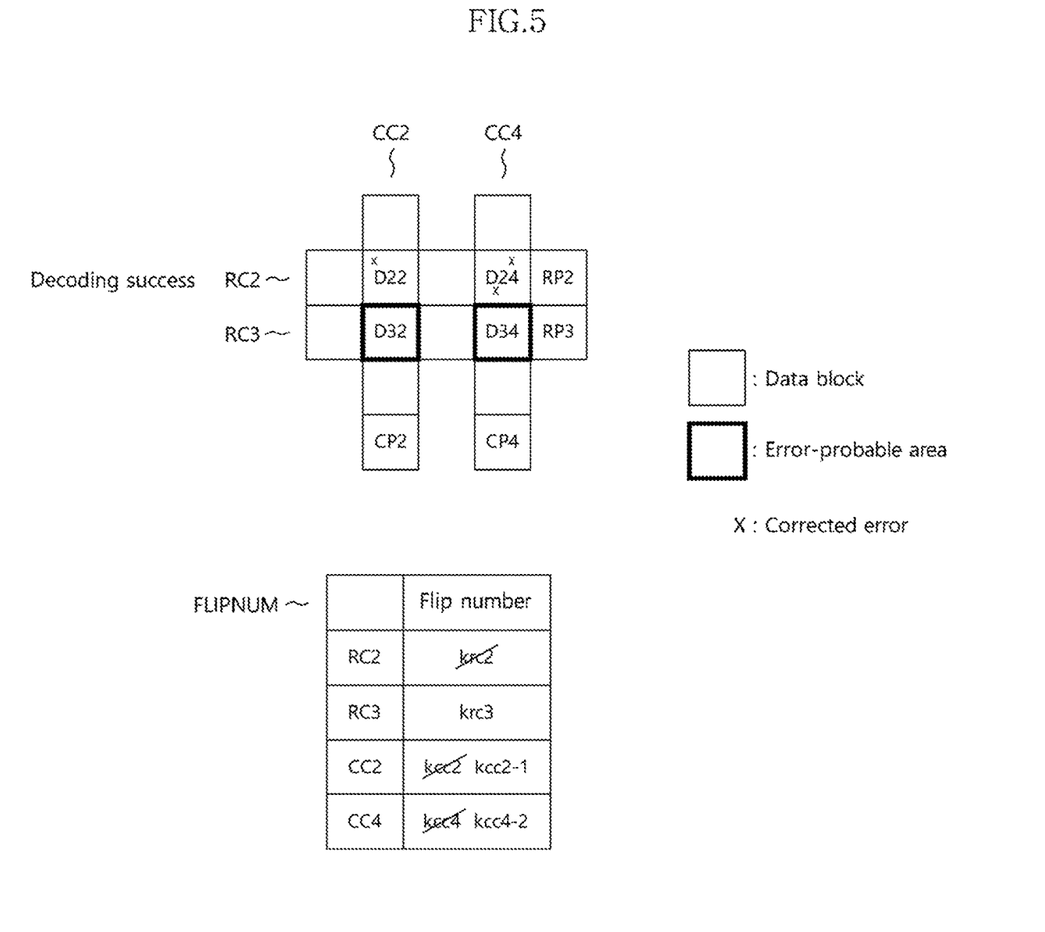
FIG. 5 is a representation of an example of a diagram to assist in the explanation of a method for the flip number management section of FIG. 1 to adjust a flip number according to a result of a decoding operation.

FIG. 5 is a representation of an example of a diagram to assist in the explanation of a method for the flip number management section 15 of FIG. 1 to adjust a flip number according to a result of a decoding operation. The situation illustrated in FIG. 5 may be the same as the situation illustrated in FIG. 4. However, the flip number management section 15 may decrease the flip number of a selected codeword by an adjustment value equal to or greater than "2".

For example, when the decoding operation for the row codeword RC2 succeeds, the flip number management section 15 may determine the correction rates of the corrected data blocks D22 and D24. A correction rate may mean how many errors are corrected in a corresponding corrected data block. The correction rate may be determined based on the number of corrected errors in the corresponding corrected data block. For example, the correction rate of the data block D24 in which two errors are corrected may be higher than the correction rate of the data block D22 in which one error is corrected.

The flip number management section 15 may determine adjustment values corresponding to the respective correction rates. The higher a correction rate is, the greater an adjustment value may be. The flip number management section 15 may decrease flip numbers by the determined adjustment values. Hence, the flip number management section 15 may decrease the flip number kcc4 of the column codeword CC4 including the data block D24 of the higher correction rate by, for example, "2."

Meanwhile, the flip number management section 15 may adjust a flip number to "0" based on an adjustment value equal to or greater than "1." If the flip number of a certain codeword is adjusted to "0," the decoder 12 may perform a decoding operation without performing a flip operation for the corresponding codeword.

According to an embodiment, when a decoding operation for a certain codeword of the first direction succeeds, the flip number management section 15 may decrease the flip numbers of all codewords of the second direction which intersect with the corresponding codeword. Namely, when a decoding operation for a certain codeword of the first direction succeeds, the flip number management section 15 may decrease the flip numbers of all codewords of the second direction which include intersections as error-probable areas.

Figure 6:
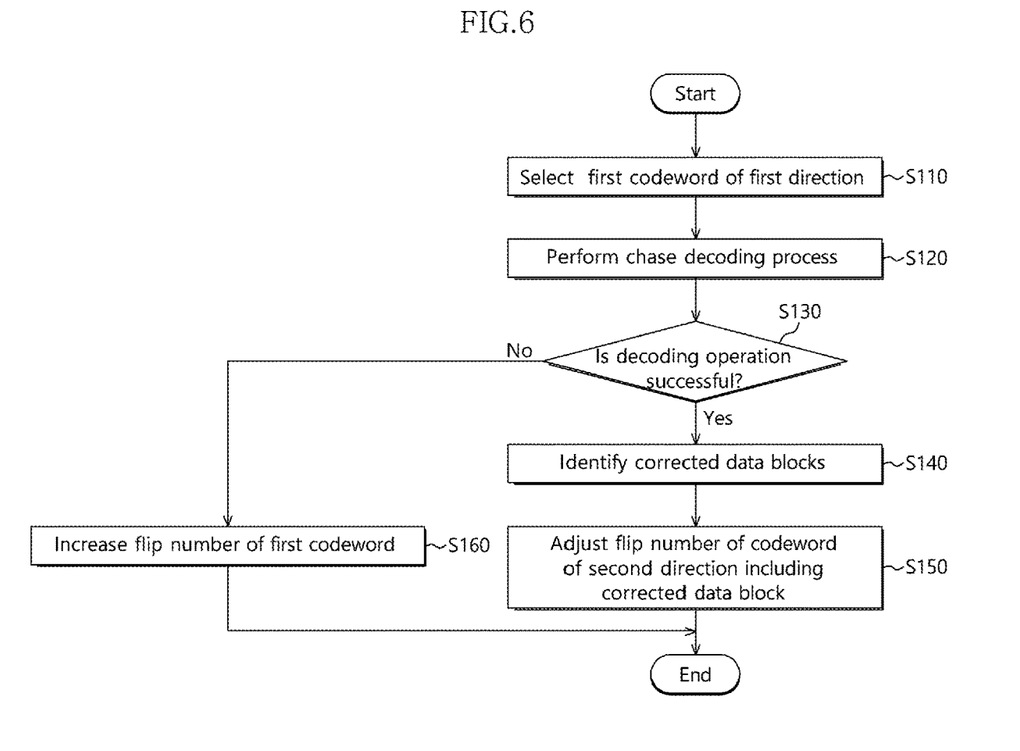
FIG. 6 is a representation of an example of a flow chart to assist in the explanation of a method for operating the error correction circuit of FIG. 1.

FIG. 6 is a representation of an example of a flow chart to assist in the explanation of a method for operating the error correction circuit 10 of FIG. 1. FIG. 6 illustrates a method for the error correction circuit 10 to adjust a flip number depending on a result of a decoding operation for a first codeword.

Referring to FIG. 6, at step S110, the decoder controller 11 may select a first codeword of a first direction in the data chunk DCH.

At step S120, the decoder controller 11 may perform a chase decoding process on the first codeword. The decoder controller 11 may repeat a flip operation for the first codeword based on a predetermined flip number, and the decoder 12 may repeat a decoding operation for the first codeword.

At step S130, the decoder controller 11 may determine whether the decoding operation for the first codeword has succeeded. When it is determined that the decoding operation has succeeded, the process may proceed to step S140.

At the step S140, the flip number management section 15 may identify at least one corrected data block in the first codeword. In an embodiment, for example, at step S140, the flip number management section 15 may determine the correction rates of the corrected data blocks. A correction rate may mean how many errors are corrected in a corresponding corrected data block. The correction rate may be determined based on the number of corrected errors in the corresponding corrected data block.

At step S150, the flip number management section 15 may adjust a flip number of a codeword of a second direction including the corrected data block. The flip number management section 15 may decrease the flip number of the codeword of the second direction. According to an embodiment, the flip number management section 15 may determine an adjustment value corresponding to the correction rate of the corrected data block, and decrease the flip number by the adjustment value. According to an embodiment, for example, the flip number management section 15 may determine an adjustment value corresponding to the corrected data block for an intersecting codeword in a second direction, and decrease the flip number by the adjustment value.

However, when it is determined at the step S130 that the decoding operation has failed resultantly, the process may proceed to step S160.

At the step S160, the flip number management section 15 may increase the flip number of the first codeword. In a next chase decoding process for the first codeword, the increased flip number of the first codeword may become the predetermined flip number of the first codeword of step S120. Meanwhile, the increased flip number of the first codeword may be decreased according to a result of a chase decoding process for other codewords in a second direction.

In an embodiment, the flip number management section 15 may determine whether a flip number of the first codeword is greater than or equal to a predetermined threshold number. If the flip number is increased to a predetermined threshold number or is greater than or equal to the predetermined threshold number, the chase decoding process for the corresponding codeword may be ended as a failure.

Figure 7:
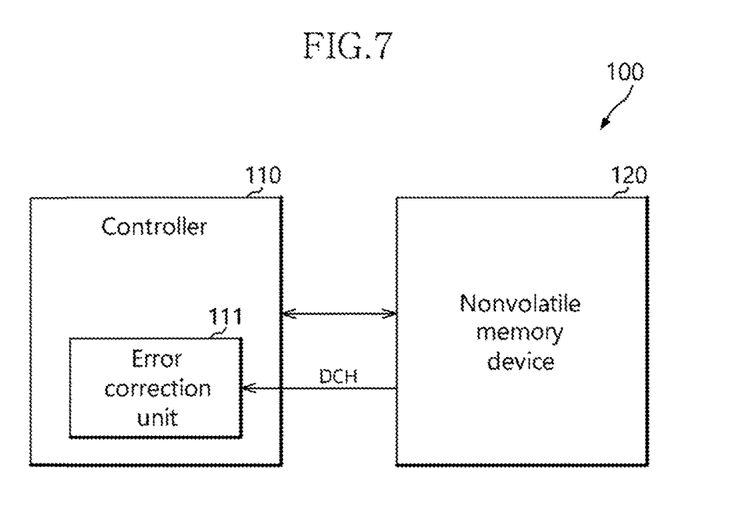
FIG. 7 is a block diagram illustrating a representation of an example of a data storage device in accordance with an embodiment.

FIG. 7 is a block diagram illustrating a representation of an example of a data storage device 100 in accordance with an embodiment.

The data storage device 100 may be configured to store data provided from an external device, in response to a write request from the external device. Also, the data storage device 100 may be configured to provide stored data to the external device, in response to a read request from the external device.

The data storage device 100 may be configured as a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The data storage device 100 may include a controller 110 and a nonvolatile memory device 120.

The controller 110 may control general operations of the data storage device 100. The controller 110 may store data in the nonvolatile memory device 120 in response to a write request transmitted from the external device, and may read data stored in the nonvolatile memory device 120 and output read data to the external device in response to a read request transmitted from the external device.

The controller 110 may include an error correction unit 111. The error correction unit 111 may be configured in substantially the same manner as the error correction circuit 10 of FIG. 1. The error correction unit 111 may perform an error correction operation as described above with reference to FIGS. 1 to 6, for a data chunk DCH read from the nonvolatile memory device 120.

The nonvolatile memory device 120 may store data transmitted from the controller 110 and read out stored data and transmit read-out data to the controller 110, according to the control of the controller 110.

The nonvolatile memory device 120 may include a flash memory, such as a NAND flash or a NOR flash, a Ferro-electrics Random Access Memory (FeRAM), a Phase-Change Random Access Memory (PCRAM), a Magnetoresistive Random Access Memory (MRAM), a Resistive Random Access Memory (ReRAM), and the like.

While it is illustrated in FIG. 7 that the data storage device 100 includes one nonvolatile memory device 120, it is to be noted that the number of nonvolatile memory devices included in the data storage device 100 is not limited thereto.

Figure 8:
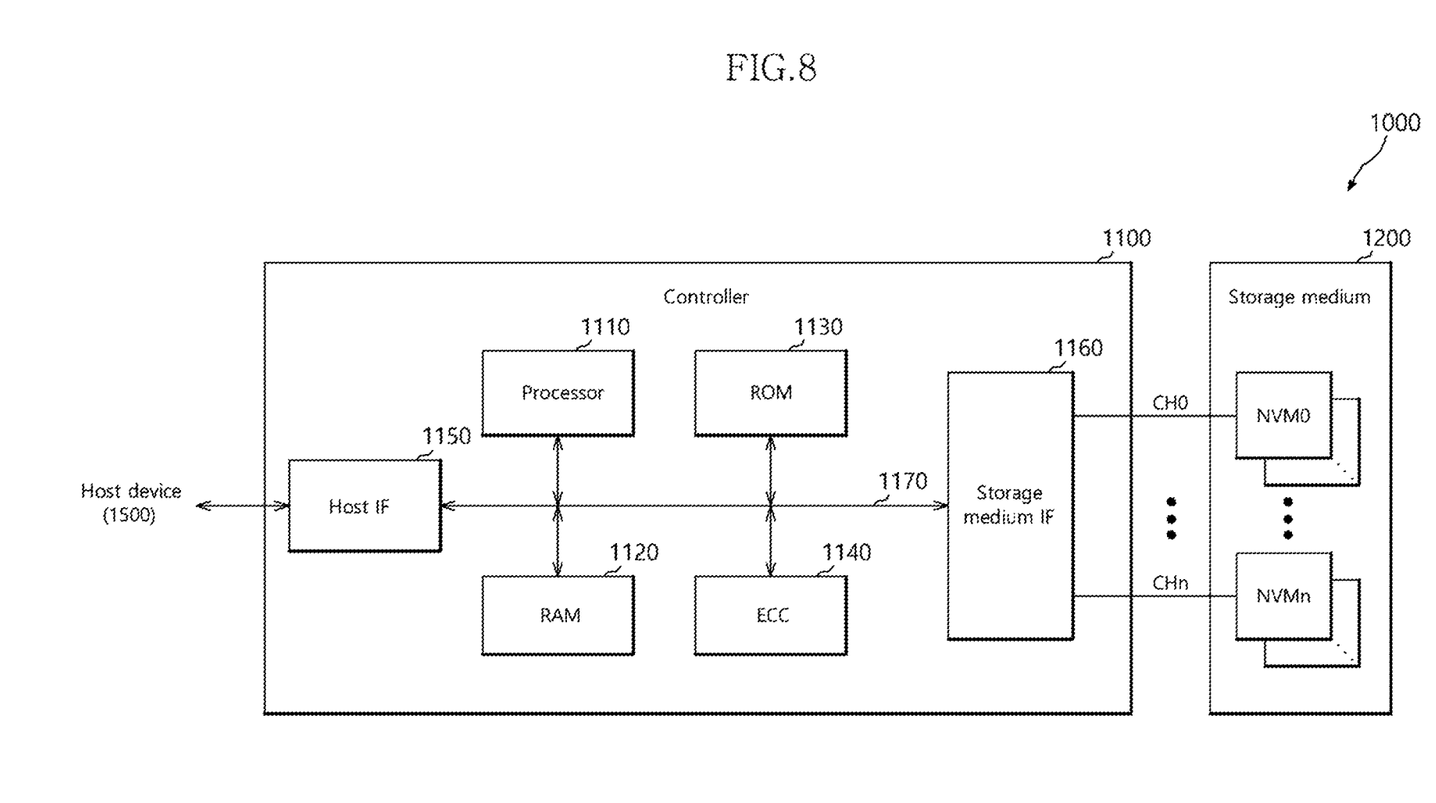
FIG. 8 is a block diagram illustrating a representation of an example of a solid state drive (SSD) in accordance with an embodiment.

FIG. 8 is a block diagram illustrating a representation of an example of a solid state drive (SSD) 1000 in accordance with an embodiment.

The SSD 1000 may include a controller 1100 and a storage medium 1200.

The controller 1100 may control data exchange between a host device 1500 and the storage medium 1200. The controller 1100 may include a processor 1110, a RAM 1120, a ROM 1130, an ECC unit 1140, a host interface (IF) 1150 and a storage medium interface 1160 which are coupled through an internal bus 1170.

The processor 1110 may control general operations of the controller 1100. The processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as a merge operation, a wear leveling operation, and so forth.

The RAM 1120 may store programs and program data to be used by the processor 1110. The RAM 1120 may temporarily store data transmitted from the host interface 1150 before transferring it to the storage medium 1200, and may temporarily store data transmitted from the storage medium 1200 before transferring it to the host device 1500.

The ROM 1130 may store program codes to be read by the processor 1110. The program codes may include commands to be processed by the processor 1110, for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm. The ECC unit 1140 may be configured in substantially the same manner as the error correction circuit 10 of FIG. 1. The ECC unit 1140 may perform an error correction operation as described above with reference to FIGS. 1 to 6.

The host interface 1150 may exchange data processing requests, data, etc. with the host device 1500.

The storage medium interface 1160 may transmit control signals and data to the storage medium 1200. The storage medium interface 1160 may receive data transmitted from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and a read operation according to control of the controller 1100.

Figure 9:
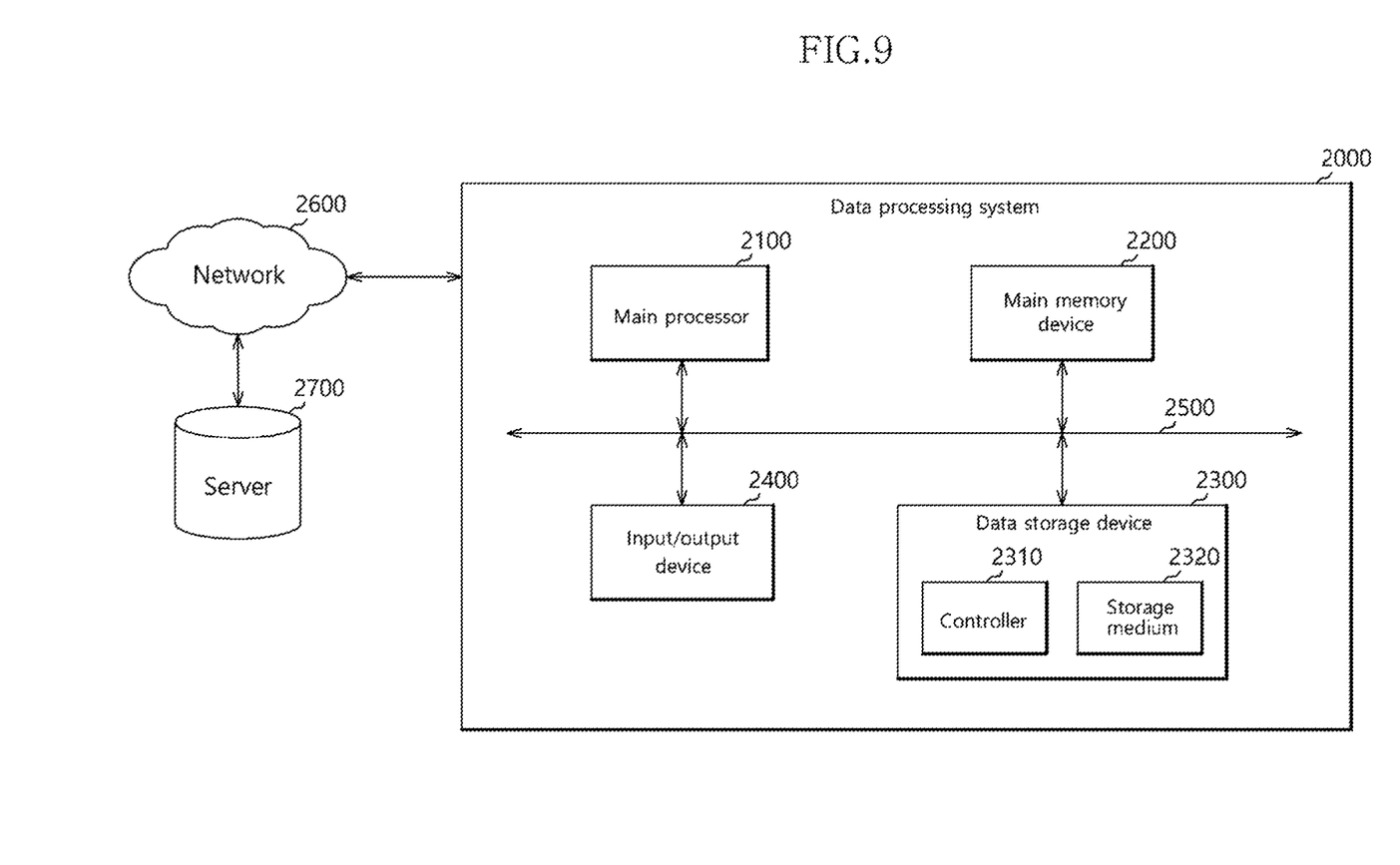
FIG. 9 is a block diagram illustrating a representation of an example of a data processing system to which the data storage device in accordance with the embodiments is applied.

FIG. 9 is a block diagram illustrating a representation of an example of a data processing system 2000 in accordance with an embodiment.

The data processing system 2000 may include a computer, a laptop, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be a central processing unit, for example, such as a microprocessor. The main processor 2100 may execute software such as an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate substantially similarly to the data storage device 100 of FIG. 7 or the SSD 1000 of FIG. 8.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a LAN (local area network), a WAN (wide area network), a wireless network, and so on. The data processing system 2000 may include a network interface (not illustrated) to access the network 2600.

While various embodiments have been described above, it will be understood to those skilled in the art that the embodiments described are examples only. Accordingly, the error correction circuit, the operating method thereof and the data storage device including the same described herein should not be limited based on the described embodiments.

What is claimed is:

1. An error correction circuit comprising:
a decoder controller configured to receive a data chunk including a plurality of data blocks, each of the data blocks being included in a corresponding codeword of a first direction and a corresponding codeword of a second direction; and
a decoder configured to perform a decoding operation for a codeword included in the data chunk according to control of the decoder controller,
wherein the decoder controller manages flip numbers corresponding to codewords for each of which the decoding operation fails, identifies at least one corrected data block in a first codeword of the first direction when a decoding operation for the first codeword succeeds, selects a second codeword of the second direction including the at least one corrected data block, adjusts a flip number of the second codeword among the flip numbers, and performs a chase decoding process for the second codeword based on the flip number.

2. The error correction circuit according to claim 1, wherein the decoder controller decreases the flip number when adjusting the flip number.

3. The error correction circuit according to claim 1, wherein the decoder controller determines an adjustment value corresponding to a correction rate of the at least one corrected data block, and adjusts the flip number by the adjustment value.

4. The error correction circuit according to claim 3, wherein the correction rate corresponds to the number of errors corrected in the at least one corrected data block.

5. The error correction circuit according to claim 3, wherein, if the correction rate increases, the adjustment value increases.

6. The error correction circuit according to claim 1, wherein the decoder controller determines an adjustment value corresponding to a corrected data block, in the first codeword, intersecting with the second codeword, and adjusts the flip number by the adjustment value.

7. The error correction circuit according to claim 1,
wherein, when performing the chase decoding process, the decoder controller performs a flip operation by flipping different combinations of bits of the flip number within a flip range of the second codeword, and
wherein the decoder repeats a decoding operation for the second codeword for which the flip operation is performed.

8. The error correction circuit according to claim 1, wherein the decoder controller increases a flip number of the first codeword among the flip numbers when the decoding operation for the first codeword fails.

9. A data storage device comprising:
a nonvolatile memory device configured to read and output a data chunk including a plurality of data blocks, each of the data blocks being included in a corresponding codeword of a first direction and a corresponding codeword of a second direction; and
an error correction circuit including a decoder controller and a decoder configured to perform a decoding operation for a codeword included in the data chunk according to control of the decoder controller,
wherein the decoder controller manages flip numbers corresponding to codewords for each of which the decoding operation fails, identifies at least one corrected data block in a first codeword of the first direction when a decoding operation for the first codeword succeeds, selects a second codeword of the second direction including the at least one corrected data block, adjusts a flip number of the second codeword among the flip numbers, and performs a chase decoding process for the second codeword based on the flip number.

10. The data storage device according to claim 9, wherein the decoder controller decreases the flip number when adjusting the flip number.

11. The data storage device according to claim 9, wherein the decoder controller determines an adjustment value corresponding to a correction rate of the at least one corrected data block, and adjusts the flip number by the adjustment value.

12. The data storage device according to claim 11, wherein the correction rate corresponds to a number of errors corrected in the at least one corrected data block.

13. The data storage device according to claim 11, wherein, if the correction rate increases, the adjustment value increases.

14. The data storage device according to claim 9, wherein the decoder controller determines an adjustment value corresponding to a corrected data block, in the first codeword, intersecting with the second codeword, and adjusts the flip number by the adjustment value.

15. The data storage device according to claim 9,
wherein, when performing the chase decoding process, the decoder controller performs a flip operation by flipping different combinations of bits of the flip number within a flip range of the second codeword, and
wherein the decoder repeats a decoding operation for the second codeword for which the flip operation is performed.

16. The data storage device according to claim 9, wherein the decoder controller increases a flip number of the first codeword among the flip numbers when the decoding operation for the first codeword fails.

17. A decoder controller comprising:
a flip number management section configured to, after a decoding operation for a codeword of a first direction succeeds, decrease flip numbers of all codewords of a second direction each of which intersects with the codeword of the first direction and has a corrected data block of the codeword.

18. The decoder controller according to claim 17, wherein the decoding operation for the codeword of the first direction succeeds if an error correction operation for the codeword completes and all of the data blocks for the codeword of the first direction are decoded.

* * * * *